(12) United States Patent
Stiens et al.

(10) Patent No.: US 11,365,483 B2
(45) Date of Patent: Jun. 21, 2022

(54) CUTTING TOOL WITH TEXTURED ALUMINA LAYER

(71) Applicant: WALTER AG, Tubingen (DE)

(72) Inventors: Dirk Stiens, Tubingen (DE); Thorsten Manns, Tubingen (DE)

(73) Assignee: WALTER AG, Tubingen (DE)

( * ) Notice: Subject to any disclaimer, the term of this patent is extended or adjusted under 35 U.S.C. 154(b) by 0 days.

(21) Appl. No.: 16/310,975

(22) PCT Filed: Jun. 20, 2017

(86) PCT No.: PCT/EP2017/064997
§ 371 (c)(1),
(2) Date: Dec. 18, 2018

(87) PCT Pub. No.: WO2018/001784
PCT Pub. Date: Jan. 4, 2018

(65) Prior Publication Data
US 2019/0338424 A1  Nov. 7, 2019

(30) Foreign Application Priority Data

Jul. 1, 2016  (EP) .................................... 16177567

(51) Int. Cl.
*C23C 28/04* (2006.01)
*C23C 16/02* (2006.01)
(Continued)

(52) U.S. Cl.
CPC ........ *C23C 28/044* (2013.01); *C23C 16/0272* (2013.01); *C23C 16/403* (2013.01); *C23C 28/042* (2013.01); *C23C 28/345* (2013.01)

(58) Field of Classification Search
CPC .... C23C 28/044; C23C 28/042; C23C 28/345
See application file for complete search history.

(56) References Cited

U.S. PATENT DOCUMENTS 4,180,400 A * 12/1979 Smith .................. B23B 27/148
419/17
5,920,760 A * 7/1999 Yoshimura .............. C23C 16/36
428/551
(Continued)

FOREIGN PATENT DOCUMENTS

EP  0403461 A1  12/1990
EP  0753602 A1  1/1997
(Continued)

OTHER PUBLICATIONS

Ronnby et al. (J. Vac. Sci. Technol. A 38(5) Sep./Oct. 2020) accessed Dec. 21, 2020.*
(Continued)

*Primary Examiner* — Alicia J Sawdon
(74) *Attorney, Agent, or Firm* — Corinne R. Gorski

(57) ABSTRACT

A coated cutting tool has a substrate of cemented carbide, cermet, ceramics, steel or cubic boron nitride and a multi-layered wear resistant coating deposited thereon has a total thickness from 4 to 25 µm. The multi-layered wear resistant coating includes a TiAlCN layer (a) represented by the formula Ti1-xAlxCyNz with $0.2 \leq x \leq 0.97$, $0 \leq y \leq 0.25$ and $0.7 \leq z \leq 1.15$ deposited by CVD, and a κ-$Al_2O_3$ layer (b) of kappa aluminium oxide deposited by CVD immediately on top of the TiAlCN layer (a). The Ti1-AlxCyNz layer (a) has an overall fiber texture with the {111} plane growing parallel to the substrate surface and a {111} pole figure, measured over an angle range of $0° \leq \alpha \leq 80°$ and the κ-Al2O3 layer (b) has an overall fiber texture with the {002} plane growing parallel to the substrate surface and a {002} pole figure, over an angle range of $0° \leq \alpha \leq 80°$.

13 Claims, 4 Drawing Sheets

(51) Int. Cl.
*C23C 16/40* (2006.01)
*C23C 28/00* (2006.01)

(56) References Cited

U.S. PATENT DOCUMENTS

| | | | |
|---|---|---|---|
| 10,265,785 B2 | 4/2019 | Tatsuoka | |
| 10,456,842 B2 | 10/2019 | Tatsuoka | |
| 2010/0323176 A1* | 12/2010 | Van Den Berg | C23C 30/005 428/216 |
| 2015/0064452 A1* | 3/2015 | Pitonak | C23C 16/34 428/336 |

FOREIGN PATENT DOCUMENTS

| | | |
|---|---|---|
| WO | 2005090635 A1 | 9/2005 |
| WO | 2009112115 A1 | 9/2009 |
| WO | 2015135802 A1 | 9/2015 |

OTHER PUBLICATIONS

Ruppi, S. Surface and Coatings Technology, vol. 202, pp. 4257-4269, 2008.
Yourdshahyan et al. Journal of American Ceramic Society, 82/6, pp. 1365-1380, 1999.
Canovic, S. Surface and Coatings Technology, vol. 202, pp. 522-531, 2007.

* cited by examiner (a) (b)

(a) (b)

(a) (b)

(a) (b)

CUTTING TOOL WITH TEXTURED ALUMINA LAYER

RELATED APPLICATION DATA

This application is a § 371 National Stage Application of PCT International Application No. PCT/EP 2017/064997 filed Jun. 20, 2017 claiming priority to EP 16177567 filed Jul. 1, 2016.

FIELD OF THE INVENTION

The present invention relates to a coated cutting tool consisting of a substrate of cemented carbide, cermet, ceramics, steel or cubic boron nitride and a multi-layered wear resistant coating deposited by chemical vapour deposition (CVD) and having a total thickness from 4 to 25 µm, wherein the multi-layered wear resistant coating comprises a TiAlCN layer (a) represented by the general formula $Ti_{1-x}Al_xC_yN_z$ with $0.2 \leq x \leq 0.97$, $0 \leq y \leq 0.25$ and $0.7 \leq z \leq 1.15$ and a κ-$Al_2O_3$ layer (b) of kappa aluminium oxide.

BACKGROUND OF THE INVENTION

The wear resistance of cutting tools is often improved by hard refractory coatings of different metal oxides, nitrides and carbides usually deposited by CVD or PVD techniques. Aluminum oxide ($Al_2O_3$) is widely used for wear resistant coatings on cutting tools. $Al_2O_3$ crystallizes in several different phases, and deposition of the γ-$Al_2O_3$, α-$Al_2O_3$ and κ-$Al_2O_3$ polymorphs has been achieved in industrial scale, whereby mainly the two latter polymorphs find application in commercial cutting tools.

Coatings of polycrystalline structure are known to grow with a preferential crystallographic orientation with respect to the substrate surface (fiber texture). The preferential crystallographic orientation may depend on several factors, such as coating composition, nucleation and deposition conditions, deposition surface etc. It is known that the preferential crystallographic orientation of the coating may have a significant influence on the mechanical properties and cutting performance of the coated cutting tool. For instance, it has been described to modify the deposition processes for α-$Al_2O_3$ coatings to obtain preferential crystallographic orientation with the crystallographic planes {012}, {104}, {110}, {116}, {100} or {001} preferentially growing parallel to the substrate surface. The preferential crystallographic orientation with the crystallographic plane {hkl} preferentially growing parallel to the substrate surface is also called {hkl} texture. It has been discovered that {001} textured α-$Al_2O_3$ coatings exhibit superior properties in many cutting applications and show superior wear resistance. This is due to the fact that wear of the coating mainly occurs by slip of the basal planes of the crystal lattice, and thus {001} textured coatings show a uniform wear with smooth wear surfaces as opposed to the wear mechanisms of other textures characterized by brittleness, fracture and grain pull-out (S. Ruppi, Surface and Coatings Technology 202 (2008) 4257-4269).

The preferential crystallographic orientation may be induced by the layer growth conditions, which may for kinetic or thermodynamic reasons favor the growth along certain crystallographic directions (growth texture), or it may be induced by the crystallographic orientation or structure of an underlying layer or substrate (texture by epitaxy). The control of the preferential crystallographic orientation in CVD coatings by choice of suitable process conditions is well established, especially for the most commonly applied coating layer compositions, such as Ti(C,N), TiAl(C,N) or $Al_2O_3$. Parameters which determine the growth texture may be the choice and the flow ratios of reactive gases and/or catalyst gases.

The crystal structure of κ-$Al_2O_3$ (kappa $Al_2O_3$) has been long time unclear, and it was not until the late 1980s that it was shown that the structure is primitive orthorhombic. The previous uncertainty about the crystal structure of κ-$Al_2O_3$ was due to the twinning of κ-$Al_2O_3$ grains. The twin-related domains make up a false, almost hexagonal super-lattice resulting in XRD powder diffractograms similar to those from a hexagonal structure (Y. Yourdshahyan et al., J. Am. Ceram. Soc. 82/6 (1999) 1365-1380).

EP 0 403 461 A1 discloses a body with one double layer of κ-$Al_2O_3$ and TiC or related carbides, nitrides, carbonitrides or oxycarbonitrides, wherein the $Al_2O_3$ layer in contact with said TiC layer consists of κ-$Al_2O_3$ or ϑ-$Al_2O_3$ with an epitaxial relationship: (111) TiC//(0001) κ-$Al_2O_3$, TiC// [1010] κ-$Al_2O_3$, (111) TiC//(310) ϑ-$Al_2O_3$, [110] TiC//[001] ϑ-$Al_2O_3$. The crystal structure of the κ-$Al_2O_3$ or ϑ-$Al_2O_3$O is not defined in this document, however, it may be assumed to be hexagonal. Also, the preferential crystallographic orientations of the layers are not disclosed, neither of the κ-$Al_2O_3$ or ϑ-$Al_2O_3$O layers, nor or the TiC layer.

EP 0 753 602 A1 discloses a body at least partially coated with one or more refractory layers of which at least one is a single-phase κ-$Al_2O_3$ layer with a {210} texture, i. e. the crystallographic plane {210} preferentially growing parallel to the substrate surface. The texture is obtained by careful control of the water vapor concentration during the nucleation of the $Al_2O_3$ in the CVD process.

WO 2005/090635 A1 discloses a coated body comprising an α-$Al_2O_3$ or κ-$Al_2O_3$ coating obtained by CVD in the temperature range of 750° C. to 920° C.

WO 2009/112115 A1 discloses a CVD coated body having an inner layer of TiAlC, TiAlN or TiAlCN and an outer layer of $Al_2O_3$ without specifying the crystal structure, the phase or the texture of the alumina layer.

WO 2015/135802 A1 discloses a coated cutting tool consisting of a substrate and a wear resistant coating deposited by CVD and having a total thickness from 3 to 25 µm, wherein the wear resistant coating comprises a $Ti_{1-x}Al_xC_yN_z$ layer with $0.7 \leq x \leq 1$, $0 \leq y < 0.25$ and $0.75 \leq z < 1.15$ and having a thickness of 1.5 to 17 µm. The $Ti_{1-x}Al_xC_yN_z$ layer has a lamellar structure of periodically alternating domains with different stoichiometric contents of Ti and Al wherein the domains have the same crystallographic face centered cubic (fcc) structure and the same crystallographic orientation. Transmission electron microscopy (TEM) studies on the $Ti_{1-x}Al_xC_yN_z$ layer of WO 2015/135802 A1 have revealed that the periodically alternating domain sub-structure of the $Ti_{1-x}Al_xC_yN_z$ layer exhibits a preferred growth orientation with a {111} texture, i. e. the crystallographic plane {111} growing parallel to the substrate surface.

OBJECT OF THE INVENTION

It is an object of the present invention to provide a coated cutting tool having improved wear resistance, especially improved resistance against flank wear and improved resistance against thermo-mechanical shock.

DESCRIPTION OF THE INVENTION

The present invention provides a coated cutting tool consisting of a substrate of cemented carbide, cermet, ceramics, steel or cubic boron nitride and a multi-layered wear resistant coating deposited by chemical vapour deposition (CVD) and having a total thickness from 4 to 25 µm, wherein the multi-layered wear resistant coating comprises a TiAlCN layer (a) represented by the general formula $Ti_{1-x}Al_xC_yN_z$ with $0.2 \leq x \leq 0.97$, $0 \leq y \leq 0.25$ and $0.7 \leq z \leq 1.15$ deposited by CVD, and a $\kappa$-$Al_2O_3$ layer (b) of kappa aluminium oxide deposited by CVD immediately on top of the TiAlCN layer (a), and wherein the $Ti_{1-x}Al_xC_yN_z$ layer (a) has an overall fiber texture with the $\{111\}$ plane preferentially growing parallel to the substrate surface, the fiber texture being characterized in that a $\{111\}$ pole figure of the $Ti_{1-x}Al_xC_yN_z$ layer (a), measured by X-ray diffraction or electron backscatter diffraction over an angle range of $0° \leq \alpha \leq 80°$, has an intensity maximum within $\leq 10°$ tilt angle from the sample normal, and has $\leq 50\%$ of the relative intensity measured over an angle range of $0° \leq \alpha \leq 60°$ within $\leq 20°$ tilt angle from the sample normal, and wherein the $\kappa$-$Al_2O_3$ layer (b) has an overall fiber texture with the $\{002\}$ plane preferentially growing parallel to the substrate surface, the fiber texture being characterized in that a $\{002\}$ pole figure of the $\kappa$-$Al_2O_3$ layer (b), measured by X-ray diffraction or electron backscatter diffraction over an angle range of $0° \leq \alpha \leq 80°$, has an intensity maximum within $\leq 10°$ tilt angle from the sample normal, and has $\leq 50\%$ of the relative intensity measured over an angle range of $0° \leq \alpha \leq 80°$ within $\leq 20°$ tilt angle from the sample normal.

In the context of the present invention, the term "sample normal", as used herein, means the normal perpendicular to the deposition surface plane, i.e. the normal perpendicular to the surface plane of the substrate or of the coating surface plane underneath the coating to be defined, respectively.

In the context of the present invention, the term "fiber texture" (also simply referred to as "texture"), such as defined herein by the intensity maximum of a $\{hkl\}$ pole figure of the layer within a specified tilt angle from the sample normal, means that the grains of the crystalline material are oriented with their $\{hkl\}$ crystallographic planes parallel to the substrate surface more frequently than in a random distribution. Regarding the fiber texture of the $\kappa$-$Al_2O_3$ layer (b), since the $\{001\}$ and $\{002\}$ crystallographic planes of $\kappa$-$Al_2O_3$ are parallel planes, in the following, in connection with the fiber texture of $\kappa$-$Al_2O_3$ the plane designations $\{001\}$ and $\{002\}$ have the same meaning and are interchangeable in respect of the crystallographic growth orientation of the $\kappa$-$Al_2O_3$ layer. For the definition of the preferential crystallographic growth orientation of the $\kappa$-$Al_2O_3$ layer the $\{002\}$ pole figure has been selected, since the (001) peak does not appear in the XRD spectrum due to the extinction rules which apply to the crystal lattice type.

The product of the present invention has a new coating structure with improved properties. The inventors have surprisingly found it possible to grow a highly $\{001\}$ textured $\kappa$-$Al_2O_3$ layer on the surface of a $\{111\}$ textured $Ti_{1-x}Al_xC_yN_z$ layer comprising an Al content from $x=0.2$ to $x=0.97$ and with face centered cubic (fcc) crystal structure with excellent adhesion of the $\kappa$-$Al_2O_3$ layer. This was unexpected and surprising in view of the prior art and the knowledge about the growth properties of $\kappa$-$Al_2O_3$ layers, as explained below.

It was known that nucleation and growth of the thermodynamically metastable $\kappa$-$Al_2O_3$ polymorph, as opposed to the stable $\alpha$-$Al_2O_3$ phase, normally occurs on $\{111\}$ crystallographic facets on the surface of lower layers with face centered cubic (fcc) crystal structure, such as TiC, TiN or TiCN layers (without or with very low Al content). Therein the orientation relation is [111] fcc-phase layer//[001]

$\kappa$-$Al_2O_3$, as discussed in the above cited EP 0 403 461 A1, and the growth of $\kappa$-$Al_2O_3$ is determined by the stacking sequence of dense packed atomic layers in both crystal structures deposited on top of each other. And, the $\{111\}$ crystallographic facets on the surface of the lower layers of the above-mentioned type with face centered cubic (fcc) crystal structure provide a high density of nucleation sites, and thus, good prerequisites for the growth and good adherence of dense packed $\{001\}$ crystal planes of $\kappa$-$Al_2O_3$.

In contrast to such known prior art coatings, where $\kappa$-$Al_2O_3$ is nucleated on fcc phase layers providing a high density of nucleation sites for growth of dense packed $\{001\}$ crystal planes of $\kappa$-$Al_2O_3$ on top of dense packed $\{111\}$ crystal planes, in the coatings according to the present invention the $Ti_{1-x}Al_xC_yN_z$-layers grow with a preferred grows orientation with a $\{111\}$ texture, i. e. the crystallographic plane $\{111\}$ growing parallel to the substrate surface. Due to the characteristics of the growth process, the surface of the $Ti_{1-x}Al_xC_yN_z$-layer is basically entirely terminated by $\{100\}$ crystallographic facets, thus providing extremely few nucleation sites for the $\kappa$-$Al_2O_3$. However, even though the nucleation surface provided on the lower fcc $Ti_{1-x}Al_xC_yN$ layer of the product of the present invention lacks the $\{111\}$ planes with dense packed atomic layers, and is instead terminated by $\{100\}$ planes, the product of the present invention exhibits the orientation relation [111] fcc $Ti_{1-x}Al_xC_yN$//[002] $\kappa$-$Al_2O_3$, and hence a high $\{001\}$ texture in the $\kappa$-$Al_2O_3$ layer of the inventive product.

The $\{111\}$ fiber texture of the $Ti_{1-x}Al_xC_yN$ layer (a) of the present invention is characterized in that the $\{111\}$ pole figure of the $Ti_{1-x}Al_xC_yN$ layer (a), measured by X-ray diffraction or electron backscatter diffraction (EBSD), has an intensity maximum within $\leq 10°$, preferably $\leq 5°$, tilt angle from the sample normal.

The $\{001\}$ fiber texture of the $\kappa$-$Al_2O_3$ layer (b) of the present invention is characterized in that the $\{002\}$ pole figure of the $\kappa$-$Al_2O_3$ layer (b), measured by X-ray diffraction or electron backscatter diffraction (EBSD), has an intensity maximum within $\leq 10°$, preferably $\leq 5°$, tilt angle from the sample normal.

Pole figures are a proper means for the determination of the preferential crystallographic orientation (fiber texture). In the context of the present invention, pole figures of the $\{111\}$ reflection of the $Ti_{1-x}Al_xC_yN_z$ layer (a) of the present invention or of the $\{002\}$ reflection of the $\kappa$-$Al_2O_3$ layer (b) of the present invention were implemented over an angle range of $0° \leq \alpha \leq 80°$ and $0° \leq \beta \leq 360°$ with a circular arrangement of the measurement points. The intensity distribution of all measured and back-calculated pole figures was approximately rotationally symmetrical, that is to say the layers investigated exhibited fibre textures. When the pole figures are measured by XRD, the measurements over the angle ranges of $0° \leq \alpha \leq 80°$ and $0° \leq \beta \leq 360°$ are usually carried out at angle increments of for example 5° or lower.

The TiAlCN layer (a) of the present invention is preferably deposited by CVD at a reaction temperature in the range from 600° C. to 900° C., and the $\kappa$-$Al_2O_3$ layer (b) of kappa aluminium oxide of the present invention is preferably deposited by CVD at a reaction temperature in the range from 600° C. to 950° C.

In an embodiment of the coated cutting tool of the invention there is a change of the composition of the TiAlCN layer (a) near the interface of the TiAlCN layer (a) and the $\kappa$-$Al_2O_3$ layer (b). Accordingly, within a distance of 30 nm from the interface of the TiAlCN layer (a) and the $\kappa$-$Al_2O_3$ layer (b), the TiAlCN layer (a) has a chemical composition $Ti_{1-u}Al_uC_vN_w$ with a higher Ti content than the average composition of the TiAlCN layer (a), as represented by $Ti_{1-x}Al_xC_yN_z$, characterized by a difference $(x-u) \geq 0.04$, preferably $(x-u) \geq 0.06$, and with $0.16 \leq u \leq 0.93$, $0 \leq v \leq 0.25$ and $0.7 \leq w \leq 1.15$.

Without being bound to theory, the inventors assume that the change of the composition of the TiAlCN layer (a) near the interface of the TiAlCN layer (a) and the $\kappa\text{-}Al_2O_3$ layer (b) results from diffusion of AlN out of the TiAlCN layer (a) and into the $\kappa\text{-}Al_2O_3$ layer (b). The inventors have observed that this change of composition, which is probably due to diffusion at the interface, has an advantageous effect on the adhesion of the layers (a) and (b) to each other.

According to the present invention, it is preferred that the surface of the $Ti_{1-x}Al_xC_yN_z$ layer (a) forming the interface to the $\kappa\text{-}Al_2O_3$ layer (b) is terminated by facets of $\{100\}$ crystallographic planes. Thereby, the facets of the $\{100\}$ crystallographic planes include an angle of about 54.7° with the $\{111\}$ crystallographic plane that is preferentially orientated parallel to the substrate surface. The facets of the $\{100\}$ crystallographic planes terminating the $Ti_{1-x}Al_xC_yN_z$ layer (a) reflect the growing faces for the $\kappa\text{-}Al_2O_3$ layer (b). Even though the facets of the $\{100\}$ crystallographic planes orientated in this way provide only very few nucleation sites for $\kappa\text{-}Al_2O_3$, it has surprisingly been found that there is satisfying nucleation and growth of the $\kappa\text{-}Al_2O_3$ with strong $\{001\}$ fiber texture.

It has been observed by the inventors that $\{100\}$ textured TiAlCN layers are also terminated by facets of the $\{100\}$ crystallographic planes, which are in this case, orientated parallel to the substrate surface. However, even though the surface of the TiAlCN layer (a) is terminated by facets of the $\{100\}$ crystallographic planes as well, only being oriented differently with respect to the substrate surface, $\kappa\text{-}Al_2O_3$ nucleates essentially without any texture.

In another embodiment of the invention >90%, preferably >95%, most preferably >99% of the TiAlCN layer (a) has face centered cubic (fcc) crystal structure.

In another embodiment of the invention the TiAlCN layer (a) has a lamellar structure of alternating TiAlCN sub-layers of different Ti and Al stoichiometric contents, wherein the TiAlCN sub-layers have a thickness of 150 nm or less, preferably 50 nm or less.

In another embodiment of the invention, between grains of the TiAlCN layer (a) having face centered cubic (fcc) crystal structure and being represented by the formula $Ti_{1-x}Al_xC_yN$ there exist grain boundary precipitates of the chemical composition $Ti_{1-o}Al_oC_pN_q$ with and a higher Al content than the average composition of the TiAlCN layer (a), as represented by $Ti_{1-x}Al_xC_yN_z$, characterized by a difference $(o-x) \geq 0.05$, preferably $(o-x) \geq 0.10$, and with $0.25 \leq o \leq 1.05$, $0 \leq p \leq 0.25$ and $0.7 \leq q \leq 1.15$. The said grain boundary precipitates at least partially consist of hexagonal phase h-AlN being formed by phase transformation from fcc-TiAlCN. Since the hexagonal phase has a higher molar volume than the face centered cubic (fcc) phase, a volume expansion occurs upon phase transformation and a shift of the residual stress state of the fcc-TiAlCN towards higher compressive residual stress. The increase of compressive residual stress improves the resistance against crack formation in the coating and promotes the toughness behaviour of the coated tool, especially when used in operations of interrupted cut.

In a preferred embodiment of the invention the thickness of the TiAlCN layer (a) is from 2 µm to 14 µm, preferably from 2.5 µm to 6 µm.

In another preferred embodiment of the invention the thickness of the $\kappa\text{-}Al_2O_3$ layer (b) is from 1 µm to 9 µm, preferably from 1.5 µm to 6 µm.

In another preferred embodiment of the invention the multi-layered wear resistant coating comprises, in addition to the TiAlCN layer (a) and the $\kappa\text{-}Al_2O_3$ layer (b), between the substrate surface and the TiAlCN layer (a) and/or above the $\kappa\text{-}Al_2O_3$ layer (b) one or more refractory layer(s) consisting of oxide, carbide, nitride, oxycarbide, oxynitride, carbonitride, oxycarbonitride or borocarbonitride of one or more of the elements of groups 4A, 5A or 6A of the periodic table or Al or Si, or combinations thereof, being deposited by chemical vapour deposition (CVD), and each refractory layer having a thickness of from 0.5 to 6 µm.

Preferred examples of additional refractory layer(s) between the substrate surface and the TiAlCN layer (a) consist of titanium nitride, titanium carbide, titanium carbonitride, zirconium nitride, zirconium carbide, zirconium carbonitride, hafnium nitride, hafnium carbide or hafnium carbonitride. Most preferred is a titanium nitride layer.

Preferred examples of additional refractory layer(s) above the $\kappa\text{-}Al_2O_3$ layer (b) one or more refractory layer(s) consisting of titanium aluminum carbonitride, aluminum nitride, titanium nitride, titanium carbide, titanium carbonitride, zirconium nitride, zirconium carbide, zirconium carbonitride, hafnium nitride, hafnium carbide or hafnium carbonitride.

In another preferred embodiment of the invention the multi-layered wear resistant coating comprises an outermost top coating of a thickness between 0.1 to 3 µm, preferably between 0.2 to 2 µm, more preferably between 0.5 to 1.5 µm, consisting of of TiN, TiC, TiCN, ZrN, ZrCN, HfN, HfCN, VC, TiAlN, TiAlCN, AlN or combinations or multilayers thereof. The thin outermost coating (top coating) may be provided for smoothness or lubricating purposes and/or as a detection layer to indicate wear of the tool by the degree and place of abrasion of the outermost coating.

In another preferred embodiment of the invention the first refractory layer immediately on top and in contact with the substrate surface consists of Ti(C,N), TiN, TiC, Ti(B,C,N), HfN, Zr(C,N) or combinations thereof, preferably the first refractory layer adjacent to the substrate surface consists of Ti(C,N). The advantage of providing a first refractory layer of this type immediately on top and in contact with the substrate surface is improved adhesion of the subsequent layers.

BRIEF DESCRIPTION OF THE FIGURES

FIG. 2 (b) shows a cross section through the pole figure of FIG. 2 (a) over the range of the alpha-angle from 0 to 90 degrees at a fixed beta angle of 0°; the abscissa shows the angle range from 0 to 90 degrees, and the ordinate shows the measured relative intensities;

FIG. 3 (b) shows a cross section through the pole figure of FIG. 3 (a) over the range of the alpha-angle from 0 to 90 degrees at a fixed beta angle of 0°; the abscissa shows the angle range from 0 to 90 degrees, and the ordinate shows the measured relative intensities;

FIG. 5 (b) shows a cross section through the pole figure of FIG. 5 (a) over the range of the alpha-angle from 0 to 90 degrees at a fixed beta angle of 0°; the abscissa shows the angle range from 0 to 90 degrees, and the ordinate shows the measured relative intensities;

FIG. 6 (b) shows a cross section through the pole figure of FIG. 6 (a) over the range of the alpha-angle from 0 to 90 degrees at a fixed beta angle of 0°; the abscissa shows the the angle range from 0 to 90 degrees, and the ordinate shows the measured relative intensities;

DEFINITIONS AND METHODS

Fiber Texture

Figure 1:
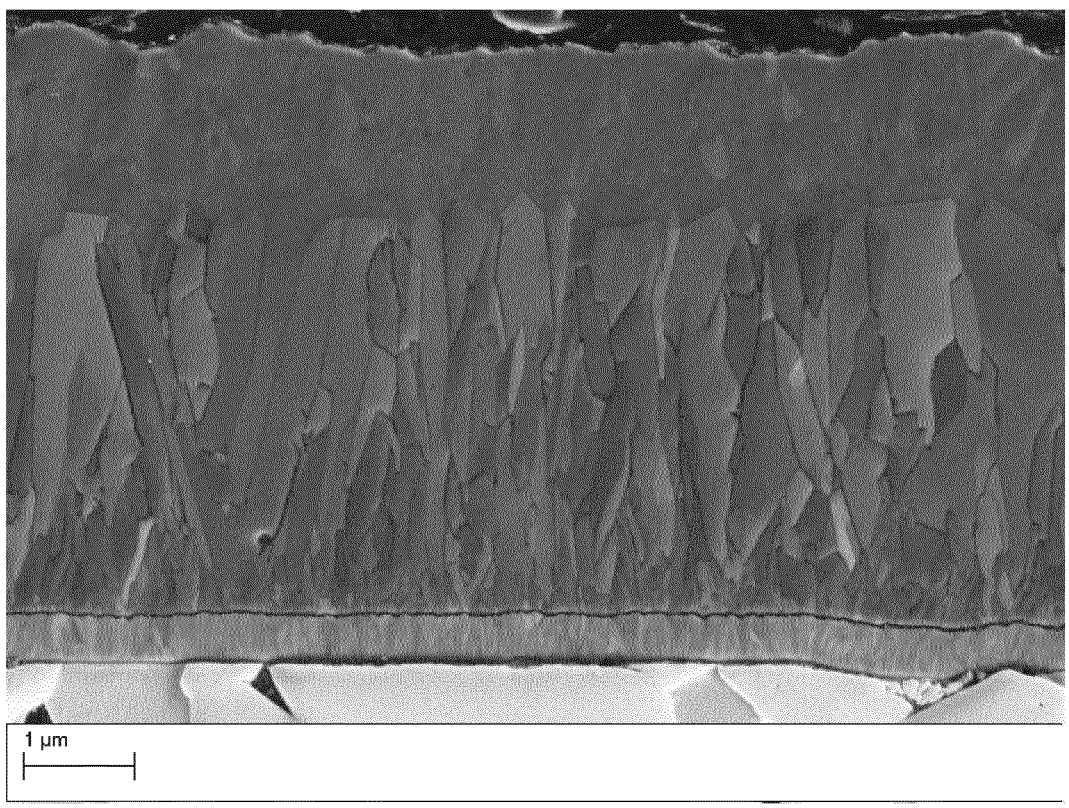
FIG. 1 shows a SEM image of a cross section of the coating of Example 1 (Invention), prepared as described below.
Figure 2:
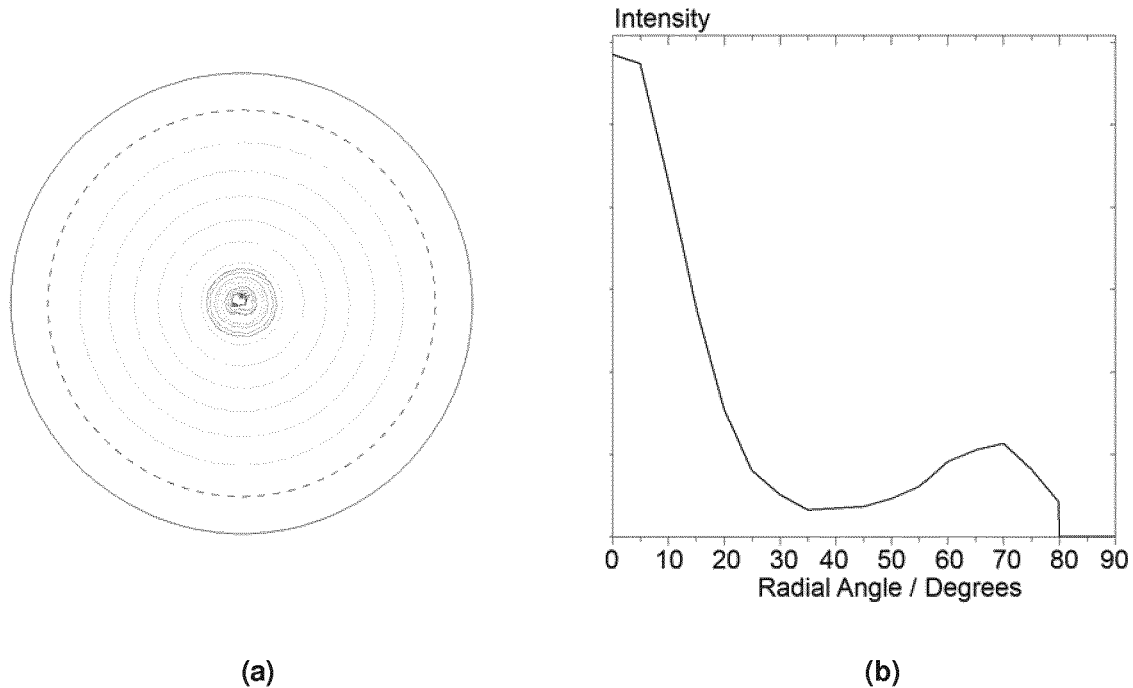
FIG. 2 (a) shows the $\{111\}$ pole figure of the TiAlN layer of the coating of Example 1 (Invention) measured by X-ray diffraction over an angle range of $0° \leq \alpha \leq 80°$ (increment 50) and $0° \leq \beta \leq 360°$ (increment 50); measured intensities are represented by isolines; the dotted circles represent the radial angles from 10 to 70 degrees, the dashed circle represents the radial angle of 80 degrees, and the unbroken circle represents the radial angle of 90 degrees.
Figure 3:
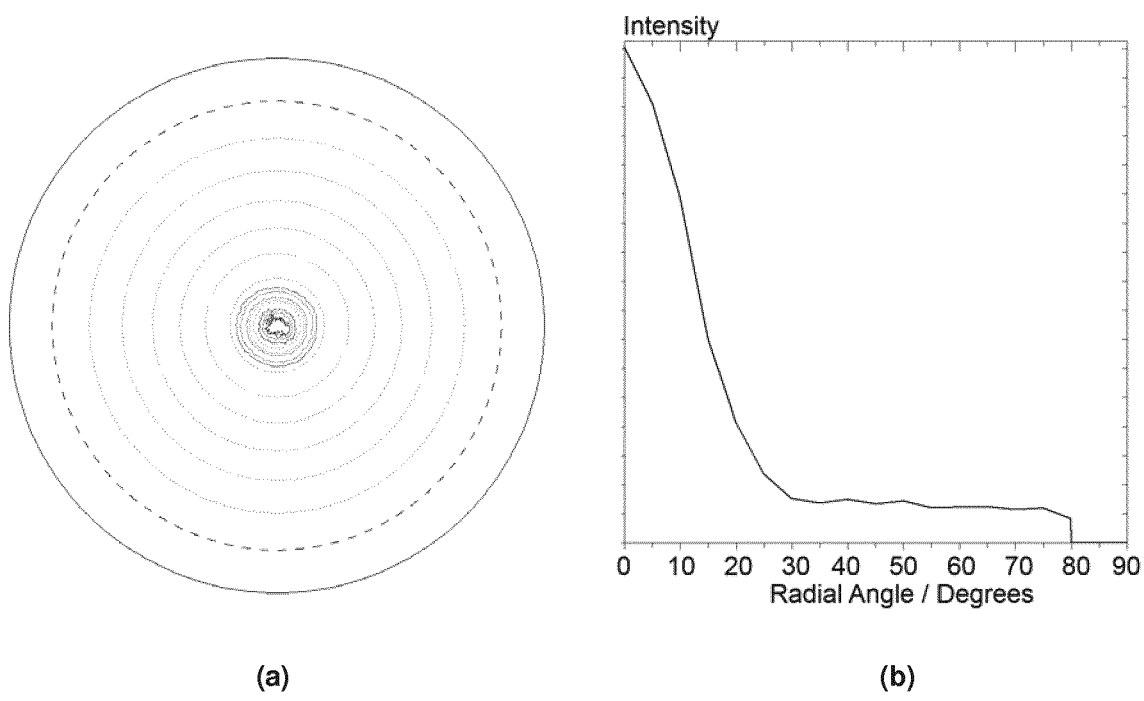
FIG. 3 (a) shows the $\{002\}$ pole figure of the $\kappa\text{-}Al_2O_3$ layer of the coating of Example 1 (Invention) measured by X-ray diffraction over an angle range of 0°≤α≤80° (increment 50) and 0°≤β≤360° (increment 50); measured intensities are represented by isolines; the dotted circles represent the radial angles from 10 to 70 degrees, the dashed circle represents the radial angle of 80 degrees, and the unbroken circle represents the radial angle of 90 degrees.

The term "fiber texture" or "texture", respectively, as used herein and as it is generally used in connection with thin films produced by vapor deposition, distinguishes the orientation of the grown grains from random orientation. Three types of textures are usually distinguished in thin films and coatings: (i) random texture, when grains have no preferred orientation; (ii) fiber texture, where the grains in the coating are oriented such that one set of geometrically equivalent crystallographic planes {hkl}, defined by the Miller indices, h, k and l, is found to be preferentially oriented parallel to the substrate surface plane, while there is a rotational degree of freedom of the grains around the fiber axis which is perpendicular to this plane, and (iii) epitaxial alignment (or in-plane texture) on single-crystal substrates, where an in-plane alignment fixes all three axes of the grain with respect to the substrate. In the context of the present application, the term "texture" is used synonymously for "fiber texture".

X-Ray Diffraction (XRD) Measurements

X-ray diffraction measurements were done on a XRD3003 PTS diffractometer of GE Sensing and Inspection Technologies using CuKα-radiation. The X-ray tube was run in point focus at 40 kV and 40 mA. A parallel beam optic using a polycapillary collimating lens with a measuring aperture of fixed size was used on the primary side whereby the irradiated area of the sample was defined in such manner that a spill over of the X-ray beam over the coated face of the sample is avoided. On the secondary side a Soller slit with a divergence of 0.4° and a 25 μm thick Ni $K_β$ filter were used.

Pole Figures

Pole figures of a particular {hkl} reflection of the analysed layer were measured using XRD, as described herein, over an angle range of 0°≤α≤80° (increment 50) and 0°≤β≤360° (increment 50) with a circular arrangement of the measurement points. For background correction of the measured intensities the background intensity was measured for each increment of α at a fixed 2θ angle which does not overlap with diffraction peaks of any of the other coating layers or the substrate. No defocusing correction was applied. If the intensity distribution of all measured and back-calculated pole figures was approximately rotationally symmetrical, the investigated layer exhibited fibre texture.

For the $Ti_{1-x}Al_xC_yN_z$ layers, pole figures may alternatively be generated from EBSD maps of the specimens with the layer being polished parallel to the substrate surface to approximately 20-80% remaining layer thickness and adequate smoothness, typically using grid sizes≤0.075 μm, map sizes≥25 μm×25 μm. When orientation maps with sufficient quality of diffraction patterns and indexing are obtained, the texture of fcc-$Ti_{1-x}Al_xC_yN_z$ within the layer may be calculated and pole figures may be plotted using commercially available software (e.g. EDAX OIM Analysis). For κ-$Al_2O_3$ layers, acquisition and correct indexing of Kikuchi diffraction patterns is often hindered by the high density of twins or other stacking faults within the grains of the polycrystalline layer. Therefore, XRD measurements are recommended for a safe determination of texture in this case. A detailed procedure of EBSD sample preparation, measurement and processing for the determination of the minimum content of fcc-phase in the TiAlCN layer is given below, and from the data sets acquired according to this procedure the texture may be determined as well. Generally, it is within the purview of the person skilled in the art to perform specimen preparation, EBSD measurement and data processing in an appropriate manner.

For checking and confirming the preferential crystallographic orientation of a {hkl} crystal plane, additional pole figures were measured from at least two further reflections for cubic crystal systems or from at least three further reflections for other (non-cubic) crystal systems, respectively. From the data of a sufficient number of XRD pole figure measurements the orientation density distribution function (ODF) was calculated using the software Labo-Tex3.0 from LaboSoft, Poland, and the preferential crystallographic orientation could be represented by an inverse pole figure. The presentation of the ODF as an inverse pole figure is suitable to demonstrate the crystallographic orientation and sharpness of a fiber texture present in the sample. In EBSD (electron backscatter diffraction) measurements, the ODF may be calculated from a statistically relevant number of individual local orientation measurements using commercially available EBSD data processing software, e.g. EDAX OIM Analysis. [L. Spieß et al., Moderne Röntgenbeugung, $2^{nd}$ edition, Vieweg & Teubner, 2009].

Transmission Electron Microscopy (TEM) EDS Analysis

Transmission electron microscopic (TEM) analyses were performed in a FEI Titan 80-300 microscope with field emission cathode at an acceleration voltage of 300 kV. For EDS analyses an Oxford Inca EDS system was used. The preparation of samples for TEM was made by the in-situ lift-out technique using a combined FIB/SEM equipment to cut a thin cross sectional piece out of the surface and thin the sample down to sufficient electron transparency.

Electron Backscatter Diffraction (EBSD)

EBSD analysis was performed in a Zeiss SUPRA40VP scanning electron microscope (SEM) with a field emission cathode using a 60 μm aperture and 15 kV acceleration voltage working in high current mode with a 70° incident angle of the electron beam to the polished samples surface at about 12 mm working distance. The EBSD system was EDAX (Digiview camera), and the TSL OIM Data Collection 7 and TSL OIM Analysis 7 software packages were used for data collection and analysis, respectively.

Crystal Structure Determination by Electron Backscatter Diffraction (EBSD)

The percentage of face-centered cubic (fcc) crystal structure of the $Ti_{1-x}Al_xC_yN$ of layer (b) was determined by EBSD analysis on polished cross-sections of the samples. The polishing was done according to the following procedure: 6 min grinding using a grinding disc Struers Piano 220 and water; 3 min polishing using Struers 9 μm MD-Largo diamond suspension; 3:40 min polishing using Struers 3 μm MD-dac diamond suspension; 2 min polishing using Struers 1 μm MD-Nap diamond suspension; at least 12 min chemical polishing using Struers OP-S colloidal silica suspension with 0.04 μm average particle size. Prior to SEM/EBSD analysis the specimens were ultrasonically cleaned in ethanol and demagnetized. Inspection of the accordingly prepared specimens in the FE-SEM (typically using an Everhart-Thornley secondary electron detector at 2.5 kV acceleration voltage and working distances of 3-10 mm) showed that grains of face centered cubic $Ti_{1-x}Al_xC_yN_z$ layers are polished to a flat surface, showing a pronounced orientation contrast, whereas layers of h-AlN or h-AlN precipitated at grain boundaries of fcc-$Ti_{1-x}Al_xC_yN_z$ layers are etched considerably stronger than fcc-phase grains, and therefore the surface of these proportions of the coating is lower than the fcc phase, and does not have a flat surface. Due to this topography, proportions in the coating which consist of h-AlN will give poor EBSD patterns in the EBSD analysis described below.

Typical acquisition and processing parameters for the EBSD maps are as follows: The map size is at least 50×30 μm with 50.15 μm step size and a hexagonal grid of measurement points. A 4×4 or 8×8 binning and optionally a dynamic background subtraction is performed on the camera picture, using exposure times corresponding to 20 to 100 frames per second. However, as a rule, the preparation procedure described above yielded samples which gave diffraction patterns of the $Ti_{1-x}Al_xC_yN_z$ layers with sufficient quality without performing background subtraction procedures.

Indexing of the diffraction pattern is done by Hough transformation. The data points thus recorded should ideally be indexed with an average confidence index (CI) of >0.2. The CI is calculated by the TSL OIM Analysis 7 software during automated indexing of the diffraction pattern. For a given diffraction pattern several possible orientations may be found which satisfy the diffraction bands detected by the image analysis routines. The software ranks these orientations (or solutions) using a voting scheme. The confidence index is based on the voting scheme and is given as $CI=(V_1-V_2)/V_{IDEAL}$ where $V_1$ and $V_2$ are the number of votes for the first and second solutions and $V_{IDEAL}$ is the total possible number of votes from the detected bands. The confidence index ranges from 0 to 1. Even though there are cases when a pattern may still be correctly indexed even at a confidence index of 0, the CI can be regarded as statistical a measure for the pattern quality.

Samples with rough surfaces have to be polished to a roughness in order to get satisfactory pattern quality and indexing for EBSD. A CI value greater than 0.3 corresponds to 99% accuracy of the automated pattern indexing, and generally patterns indexed with a CI>0.1 are considered to be correct.

In a first step, the EBSD map is cropped to get only the data points of the $Ti_{1-x}Al_xC_yN_z$ layer (b) to be analysed. In a second step, grain CI standardization is carried out applying a grain tolerance angle of 5° and a minimum grain size of 5 data points. In a third step, partitioning of the so generated data set is carried out applying the filter CI>0.1, i.e. all data points that, after grain CI standardization, have a lower confidence index are disregarded. The ratio (number of data points indexed as fcc phase after CI standardization and filtering/total number of data points in the cropped map) corresponds to an area ratio of fcc phase within the $Ti_{1-x}Al_xC_yN_z$ layer analysed (given in area-%). However, since pattern overlap and topography at grain boundaries lead to poor indexing of EBSD patterns obtained from fcc phase $Ti_{1-x}Al_xC_yN_z$, the values thus obtained represent a minimum fraction of fcc phase in the layer, the actual fraction being higher. Typically in $Ti_{1-x}Al_xC_yN_z$ coatings where XRD and SEM gives no indication of h-AlN, and which therefore consist practically of about 100% fcc phase, the EBSD measurement and processing method described above yields>95 area-% of the EBSD map indexed as fcc phase.

EXAMPLES

Sample Preparation

For the preparation of cutting tools according to the present invention and of comparative examples cemented carbide cutting tool substrate bodies (composition: 90.5 wt-% WC, 1.5 wt-% TaC+NbC and 8.0 wt-% Co; geometry: SEHW1204AFN) were coated in a cylindrical CVD reactor, type Bernex BPX 325S, having a height of 1250 mm and a diameter of 325 mm.

The gas flow over the substrate bodies was conducted radially from a central gas distribution tube, using a first and second precursor gas streams, PG1 and PG2. The first and second precursor gas streams, PG1 and PG2, were introduced into the reactor separately and combined immediately before entry into the reaction zone, i.e. after the outlet of the gas distribution tube.

The $Ti_{1-x}Al_xC_yN_z$ layer (a) according to the present invention is deposited at a temperature in the range of 600° C. to 900° C. Depending on the desired layer composition, the reaction gases comprise $TiCl_4$, $AlCl_3$, $CH_3CN$, $NH_3$, $N_2$, $H_2$.

The κ-$Al_2O_3$ layer (b) is then deposited directly on top of the $Ti_{1-x}Al_xC_yN_z$ layer (a) at a temperature in the range of 600° C. to 950° C. The reaction gases comprise $AlCl_3$, $COO_2$ and $H_2$, and may additionally comprises CO, HCl, $H_2S$ and/or $SF_6$. The deposition of the κ-$Al_2O_3$ layer (b) was typically carried out in two deposition steps, wherein in the first step a nucleation layer is grown, and in the second step the κ-$Al_2O_3$ layer is grown to the desired thickness. In the second step $H_2S$ and/or $SF_6$ was used as a catalyst. It is also within the scope of this invention to grow the κ-$Al_2O_3$ layer without using the said first deposition step, however, in that case a higher amount of porosity at the interface between the lower $Ti_{1-x}Al_xC_yN_z$ layer (a) and the κ-$Al_2O_3$ layer (b) was observed.

The example coatings according to the invention and the comparative examples have been obtained using the herein described equipment and the process conditions as given in the following table 1. However, it is well known in the art that the process conditions to produce CVD coatings may to a certain degree vary depending on the equipment used. It is therefore within the purview of the person skilled in the art to modify the deposition conditions and/or the equipment used to achieve the coating properties of the present invention.

Figure 4:
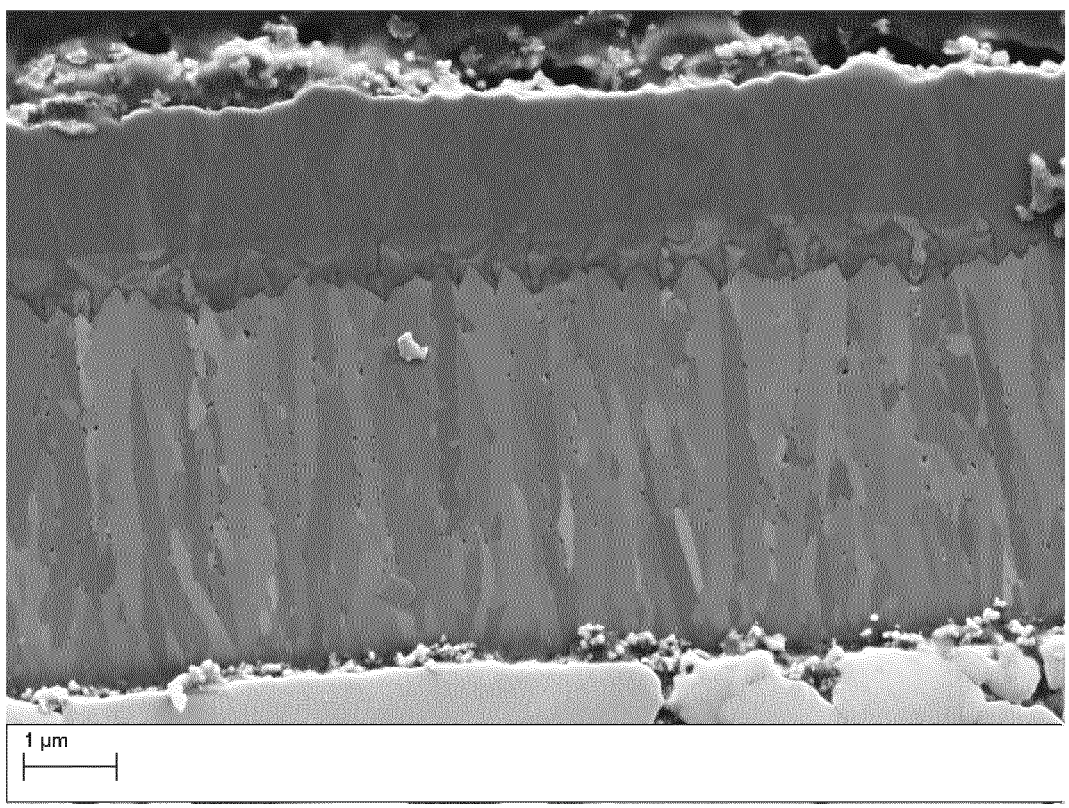
FIG. 4 shows a SEM image of a cross section of the coating of Example 2 (Comparative Example), prepared as described below.
Figure 5:
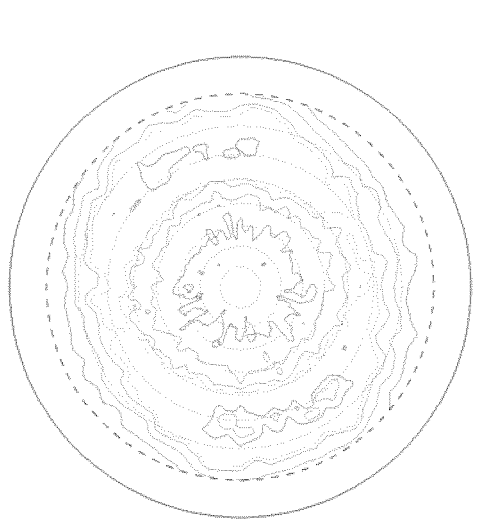
FIG. 5 (a) shows the {111} pole figure of the TiAlN layer of the coating of Example 2 (Comparative Example) measured by X-ray diffraction over an angle range of 0°≤α≤80° (increment 50) and 0°≤β≤360° (increment 50); measured intensities are represented by isolines; the dashed circle represents the radial angle of 80 degrees, and the unbroken circle represents the radial angle of 90 degrees (this representation does not comprise dotted circles representing the radial angles from 10 to 70 degrees)
Figure 5:
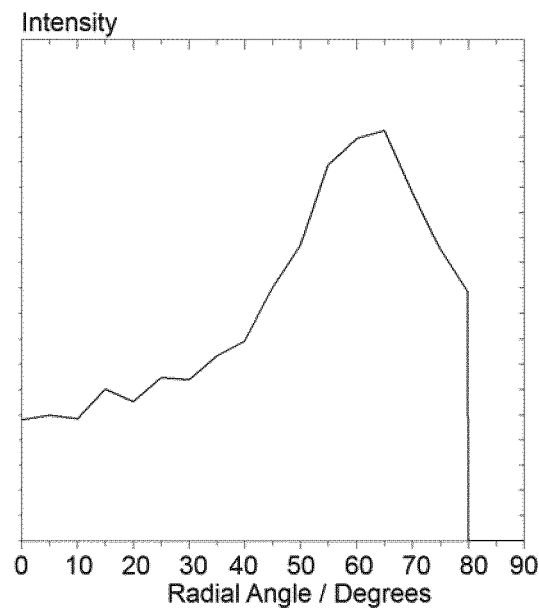
Figure 6:
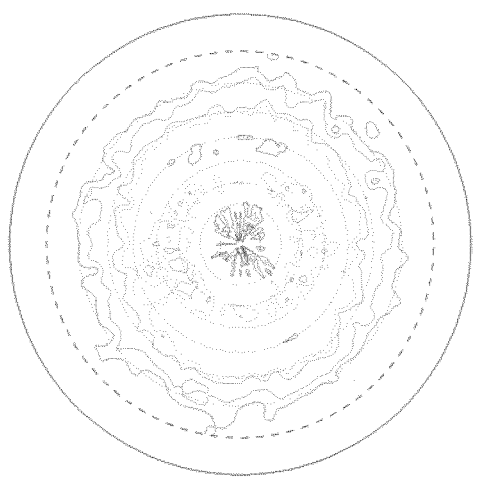
FIG. 6 (a) shows the {002} pole figure of the κ-$Al_2O_3$ layer of the coating of Example 2 (Comparative Example) measured by X-ray diffraction over an angle range of 0°≤α≤80° (increment 50) and 0°≤β≤360° (increment 50); measured intensities are represented by isolines; the dotted circles represent the radial angles from 10 to 70 degrees, the dashed circle represents the radial angle of 80 degrees, and the unbroken circle represents the radial angle of 90 degrees.
Figure 6:
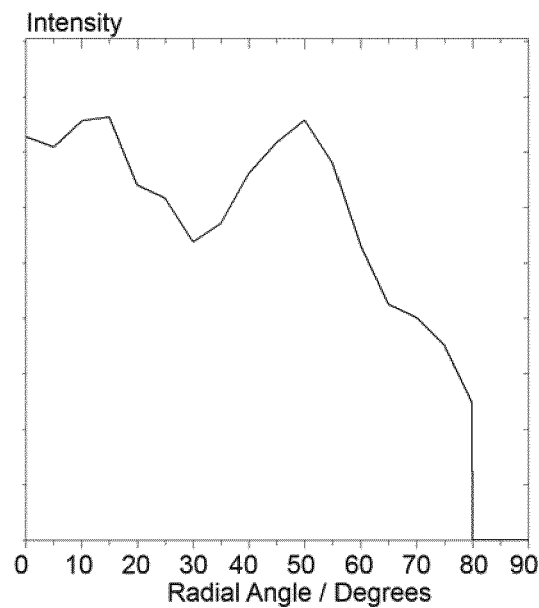

Cross-section SEM microphotographs were prepared from the example coatings and are shown in FIGS. 1 and 4. Pole figures from the TiAlN layers and the κ-$Al_2O_3$ layers of the example coatings were measured and are shown in FIGS. 2, 3, 5 and 6.

The position (tilt angle) of an intensity maximum relative to the sample normal in the {111} pole figures of the $Ti_{1-x}Al_xC_yN_z$ layer and in the {002} pole figures of the κ-$Al_2O_3$ layer for the coatings of example 1 (Invention) and example 2 (Comparative Example) are shown in Table 2. Table 2 also shows the relative intensity within ≤20 tilt angle from the sample normal as measured over an angle range of 0°≤α≤60° in the {111} pole figures of the $Ti_{1-x}Al_xC_yN$ layer and as measured over an angle range of 0°≤α≤80° in the {002} pole figures of the κ-$Al_2O_3$ layer for the coatings of Example 1 (Invention) and Example 2 (Comparative Example).

Cutting Tests

The cutting tools prepared according to Example 1 (Invention) and Example 2 (Comparative Example) were used in milling operations under the following conditions:

Workpiece material: Steel (DIN 42CrMo4)
Coolant: none
Feed per tooth: $f_z$=0.2 mm
Depth of cut: $a_p$=3 mm
Cutting speed: $v_c$=283 m/min
Setting angle: κ=45°

The development of the maximum flank wear, $V_{Bmax}$, on the main cutting edge and the number of comb cracks were observed over a milling distance of 4000 mm in 800 mm steps. The following table 3 shows the development of $V_{Bmax}$ and the number of comb cracks over the milling distance. In the milling test the cutting tool with the coating according to the present invention showed a significantly higher resistance against flank wear and against the formation of comb cracks than the comparative example.

TABLE 1

Process Conditions

| Coating (deposition step) | Time [min] | Thickness [μm] | Temperature [°C.] | Pressure [kPa] | Precursor gas stream (PG1) | | | | | | | | Precursor gas stream (PG2) | |
|---|---|---|---|---|---|---|---|---|---|---|---|---|---|---|
| | | | | | $TiCl_4$ | $AlCl_3$ | HCl | $CO_2$ | CO | $H_2S$ | $N_2$ | $H_2$ | $NH_3$ | $H_2$ |
| Example 1 (Invention) | | | | | | | | | | | | | | |
| TiN | 90 | 0.5 | 850 | 15 | 1.03 | 0 | 0 | 0 | 0 | 0 | 44.0 | 33.0 | 0 | 22.0 |
| $Ti_{1-x}Al_xN$ | 75 | 4 | 675 | 0.38 | 0.028 | 0.23 | 0 | 0 | 0 | 0 | 0 | 49.5 | 1.09 | 49.2 |
| κ-$Al_2O_3$ (nucleation step) | 30 | 2 | 850 | 7.5 | 0 | 1.32 | 1.32 | 1.84 | 1.32 | 0 | 13.2 | 54.2 | 0 | 27.1 |
| κ-$Al_2O_3$ (growth step) | 210 | | 850 | 10 | 0 | 0.93 | 1.16 | 2.32 | 1.16 | 0.35 | 0 | 70.5 | 0 | 23.5 |
| Example 2 (Comparative Example) | | | | | | | | | | | | | | |
| TiN (step 1) | 100 | 2.6 | 815 | 15 | 1.03 | 0 | 0 | 0 | 0 | 0 | 44.0 | 33.0 | 0 | 22.0 |
| TiN (step 2) | 75 | | 790 | 2 | 0.44 | 0 | 0 | 0 | 0 | 0 | 43.3 | 32.5 | 2.16 | 21.6 |
| $Ti_{1-x}Al_xN$ | 10 | 0.5 | 700 | 1 | 0.014 | 0.23 | 0 | 0 | 0 | 0 | 0 | 49.5 | 1.09 | 49.2 |
| κ-$Al_2O_3$ (nucleation step) | 30 | 2 | 850 | 7.5 | 0 | 1.32 | 1.32 | 1.84 | 1.32 | 0 | 13.2 | 54.2 | 0 | 27.1 |
| κ-$Al_2O_3$ (growth step) | 210 | | 850 | 10 | 0 | 0.93 | 1.16 | 2.32 | 1.16 | 0.35 | 0 | 70.5 | 0 | 23.5 |

TABLE 2

Pole figure data

| Sample | Example 1 (Invention) | Example 2 (Comparative) |
|---|---|---|
| $Ti_{1-x}Al_xC_yN_z$ layer | | |
| Position of intensity maximum in {111} pole figure | 0° | 65° |
| Percentage of relative intensity of {111} pole figure within ≤20° tilt angle from sample normal (0° ≤ α ≤ 60°) | 78.2% | 21.5% |
| κ-Al2O3 layer | | |
| Position of intensity maximum in {002} pole figure | 0° | 15° |
| Percentage of relative intensity of {002} pole figure within ≤20° tilt angle from sample normal (0° ≤ α ≤ 80°) | 71.2% | 30.4% |

TABLE 3

Cutting Test Results

| Milling Distance [mm] | Example 1 (Invention) | | Example 2 (Comparative Example) | |
|---|---|---|---|---|
| | Maximum Flank Wear $V_{Bmax}$ | Number of Comb Cracks | Maximum Flank Wear $V_{Bmax}$ | Number of Comb Cracks |
| 0 | 0 | 0 | 0 | 0 |
| 800 | 0.02 | 0 | 0.02 | 1 |
| 1600 | 0.04 | 0 | 0.06 | 1 |

TABLE 3-continued

Cutting Test Results

| Milling Distance [mm] | Example 1 (Invention) | | Example 2 (Comparative Example) | |
|---|---|---|---|---|
| | Maximum Flank Wear $V_{Bmax}$ | Number of Comb Cracks | Maximum Flank Wear $V_{Bmax}$ | Number of Comb Cracks |
| 2400 | 0.08 | 0 | 0.12 | 3 |
| 3200 | 0.12 | 1 | 0.20 | 3 |
| 4000 | 0.16 | 1 | 0.34 | 4 |

The invention claimed is:

1. A coated cutting tool comprising:
a substrate of cemented carbide, cermet, ceramics, steel or cubic boron nitride, the substrate having a surface; and
a multi-layered wear resistant coating deposited by chemical vapour deposition (CVD) and having a total thickness from 4 to 25 μm, the multi-layered wear resistant coating comprising a TiAlCN layer (a) represented by the formula $Ti_{1-x}Al_xC_yN_z$ with $0.2 \leq x \leq 0.97$, $0 \leq y \leq 0.25$ and $0.7 \leq z \leq 1.15$ deposited by CVD, and a κ-$Al_2O_3$ layer (b) of kappa aluminium oxide deposited by CVD immediately on top of the TiAlCN layer (a), and wherein the $Ti_{1-x}Al_xC_yN_z$ layer (a) has an overall fiber texture with a {111} plane growing parallel to the substrate surface, the fiber texture in a {111} pole figure of the $Ti_{1-x}Al_xC_yN_z$ layer (a), measured by X-ray diffraction or electron backscatter diffraction over an angle range of $0° \leq \alpha \leq 80°$, having an intensity maximum within $\leq 10°$ tilt angle from a sample normal, and having $\geq 50\%$ of a relative intensity measured over an angle range of $0° \leq \alpha \leq 60°$ within $\leq 20°$ tilt angle from the sample normal, and wherein the κ-$Al_2O_3$ layer (b) has an overall fiber texture with a {002} plane growing parallel to the substrate surface, the fiber texture in a {002} pole figure of the κ-$Al_2O_3$ layer (b), measured by X-ray diffraction or electron backscatter diffraction over an angle range of $0° \leq \alpha \leq 80°$, having an intensity maximum within $\leq 10°$ tilt angle from the sample normal, and having $\geq 50\%$ of the relative intensity measured over an angle range of $0° \leq \alpha \leq 80°$ within $\leq 20°$ tilt angle from the sample normal.

2. The coated cutting tool of claim 1, wherein the fiber texture of the $Ti_{1-x}Al_xC_yN_z$ layer (a) with the {111} pole figure of the $Ti_{1-x}Al_xC_yN_z$ layer (a), measured by X-ray diffraction or electron backscatter diffraction, having an intensity maximum within $\leq 5°$ tilt angle from the sample normal.

3. The coated cutting tool of claim 1, wherein the fiber texture of the κ-$Al_2O_3$ layer (b) with the {002} pole figure of the κ-$Al_2O_3$ layer (b), measured by X-ray diffraction or electron backscatter diffraction, having an intensity maximum within $\leq 5°$ tilt angle from the sample normal.

4. The coated cutting tool of claim 1, wherein, within a distance of 30 nm from an interface of the TiAlCN layer (a) and the κ-$Al_2O_3$ layer (b), the TiAlCN layer (a) has a chemical composition $Ti_{1-u}Al_uC_vN_w$ with a higher Ti content than an average composition of the TiAlCN layer (a), as represented by $Ti_{1-x}Al_xC_yN_z$, the difference (x−u) being greater than or equal to 0.04, with $0.16 \leq u \leq 0.93$, $0 \leq v \leq 0.25$ and $0.7 \leq w \leq 1.15$.

5. The coated cutting tool of claim 1, wherein the surface of the TiAlCN layer (a) forming the interface to the κ-$Al_2O_3$ layer (b) is terminated by facets of {100} crystallographic planes.

6. The coated cutting tool of claim 1, wherein >90% of the TiAlCN layer (a) has face centered cubic (fcc) crystal structure.

7. The coated cutting tool of claim 1, wherein the TiAlCN layer (a) has a lamellar structure of alternating TiAlCN sub-layers of different Ti and Al stoichiometric contents, and wherein each of the TiAlCN sub-layers have a thickness of 150 nm or less.

8. The coated cutting tool of claim 1, wherein between grains of the TiAlCN layer (a) having a face centered cubic (fcc) crystal structure and being represented by the formula $Ti_{1-x}Al_xC_yN_z$, there are grain boundary precipitates having a chemical composition $Ti_{1-o}Al_oC_pN_q$ with a higher Al content than the average composition of the TiAlCN layer (a), as represented by $Ti_{1-x}Al_xC_yN_z$, characterized by a difference (o−x)≥0.05, with $0.25 \leq o \leq 1.05$, $0 \leq p \leq 0.25$ and $0.7 \leq q \leq 1.15$.

9. The coated cutting tool of claim 1, wherein the thickness of the TiAlCN layer (a) is from 2 μm to 14 μm.

10. The coated cutting tool of claim 1, wherein the thickness of the κ-$Al_2O_3$ layer (b) is from 1 μm to 9 μm.

11. The coated cutting tool of claim 1, wherein the multi-layered wear resistant coating includes, in addition to the TiAlCN layer (a) and the κ-$Al_2O_3$ layer (b), between the substrate surface and the TiAlCN layer (a) and/or above the κ-$Al_2O_3$ layer (b), one or more refractory layer(s) selected from oxide, carbide, nitride, oxycarbide, oxynitride, carbonitride, oxycarbonitride or borocarbonitride of one or more of the elements of groups 4A, 5A or 6A of the periodic table or Al or Si, or combinations thereof, being deposited by chemical vapour deposition (CVD), and each refractory layer having a thickness of from 0.5 to 6 μm.

12. The coated cutting tool of claim 1, wherein the multi-layered wear resistant coating includes an outermost top coating having a thickness between 0.1 to 3 μm, selected from TiN, TiC, TiCN, ZrN, ZrCN, HfN, HfCN, VC, TiAlN, TiAlCN, AlN and combinations or multilayers thereof.

13. The coated cutting tool of claim 1, wherein a first refractory layer immediately on top and in contact with the substrate surface is selected from Ti(C,N), TiN, TiC, Ti(B,C,N), HfN, Zr(C,N) and combinations thereof.

* * * * *